United States Patent [19]
Kodama

[11] Patent Number: 5,455,803
[45] Date of Patent: Oct. 3, 1995

[54] SEMICONDUCTOR DEVICE WHICH OPERATES AT A FREQUENCY CONTROLLED BY AN EXTERNAL CLOCK SIGNAL

[75] Inventor: Yukinori Kodama, Kawasaki, Japan

[73] Assignee: Fujitsu Limited, Kawasaki, Japan

[21] Appl. No.: 231,677

[22] Filed: Apr. 25, 1994

[30] Foreign Application Priority Data

May 19, 1993 [JP] Japan ................................ 5-116815

[51] Int. Cl.⁶ ............................................. G11C 8/00
[52] U.S. Cl. ................................. 365/233; 365/230.01
[58] Field of Search ............................. 365/230.01, 233, 365/233.5, 226; 307/265, 269

[56] References Cited

U.S. PATENT DOCUMENTS

| | | | |
|---|---|---|---|
| 4,710,904 | 12/1987 | Suzuki | 365/233.5 |
| 4,754,163 | 6/1988 | Aue et al. | 307/265 |
| 4,998,222 | 3/1991 | Sussman | 365/193 |
| 5,327,394 | 7/1994 | Green et al. | 365/233.5 |
| 5,336,939 | 8/1994 | Eitrheim et al. | 307/269 |

OTHER PUBLICATIONS

Horowitz, P. et al., *The Art of Electronics*, Cambridge University Press, New York, 1987, pp. 351–354.

*Primary Examiner*—Joseph A. Popek
*Assistant Examiner*—A. Zarabian
*Attorney, Agent, or Firm*—Armstrong, Westerman, Hattori, McLeland & Naughton

[57] ABSTRACT

A semiconductor memory device includes a memory cell array, an address part for supplying address signals to the memory cell array, a read/write part for reading data from the memory cell array and writing data into the memory cell array, and an internal clock signal generating circuit for generating an internal clock signal from an external clock signal. The internal clock signal has a cycle with an active-level portion of constant duration independent of a frequency of the external clock signal and is output, as a timing signal, to predetermined structural parts of the address part and/or the read/write part.

10 Claims, 11 Drawing Sheets

FIG.4(a) (MAX OPERATING FREQUENCY) CLKA

FIG.4(b) CLKB

FIG.4(c) (1/2 OF MAX OPERATING FREQUENCY) CLKA

FIG.4(d) CLKB

FIG.5(a) CLKA
FIG.5(b) $\overline{RAS}$
FIG.5(c) $\overline{CAS}$
FIG.5(d) ADDRESS SIGNAL
FIG.5(e) CLKB
FIG.5(f) COLUMN SELECTING SIGNAL
FIG.5(g) DOUT

FIG. 6

FIG.9(a) CLKA (MAX OPERATING FREQUENCY)

FIG.9(b) CLKB

FIG.9(c) CLKA (1/2 OF MAX OPERATING FREQUENCY)

FIG.9(d) CLKB

FIG. 10

FIG.11(a) CLKA
FIG.11(b) $\overline{RAS}$
FIG.11(c) $\overline{CAS}$
FIG.11(d) ADDRESS
FIG.11(e) CLKB
FIG.11(f) COLUMN SELECTING SIGNAL
FIG.11(g) DOUT

SEMICONDUCTOR DEVICE WHICH OPERATES AT A FREQUENCY CONTROLLED BY AN EXTERNAL CLOCK SIGNAL

BACKGROUND OF THE INVENTION

1. Field of the Invention

The present invention generally relates to semiconductor integrated circuit devices, and more particularly to a semiconductor integrated circuit device that operates at a frequency controlled by a clock signal externally supplied, such as a synchronous dynamic random access memory (SDRAM).

2. Description of the Prior Art

A synchronous dynamic random access memory device (hereinafter referred to as a synchronous DRAM device) operates at an internal frequency (internal clock signal) controlled by an external clock signal supplied from the outside thereof. The frequency of the internal clock signal becomes lower (higher) as the frequency of the output clock signal becomes lower (higher). Generally, when the synchronous DRAM device is operated at the maximum operating frequency, a minimum amount of power is consumed. When the synchronous DRAM device is operated at a frequency lower than the maximum operating frequency, the operating frequency of the synchronous DRAM becomes lower than the maximum operating frequency and an increased amount of power is consumed. As the operating frequency (the frequency of the internal clock signal) becomes lower, an increased amount of power is consumed. As described above, the operating frequency (the frequency of the internal clock signal) is controlled by the external clock signal.

SUMMARY OF THE INVENTION

It is an object of the present invention to provide a semiconductor memory device that consumes a decreased amount of power when the device is operated at a frequency lower than the maximum operating frequency.

The above object of the present invention is achieved by a semiconductor memory device which includes a memory cell array, an address part for supplying address signals to the memory cell array, a read/write part for reading data from the memory cell array and writing data into the memory cell array, and an internal clock signal generating circuit for generating an internal clock signal from an external clock signal. The internal clock signal has a cycle having an active-level portion of constant duration independent of a frequency of the external clock signal and is output, as a timing signal, to predetermined structural parts of the address part and/or the read/write part.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
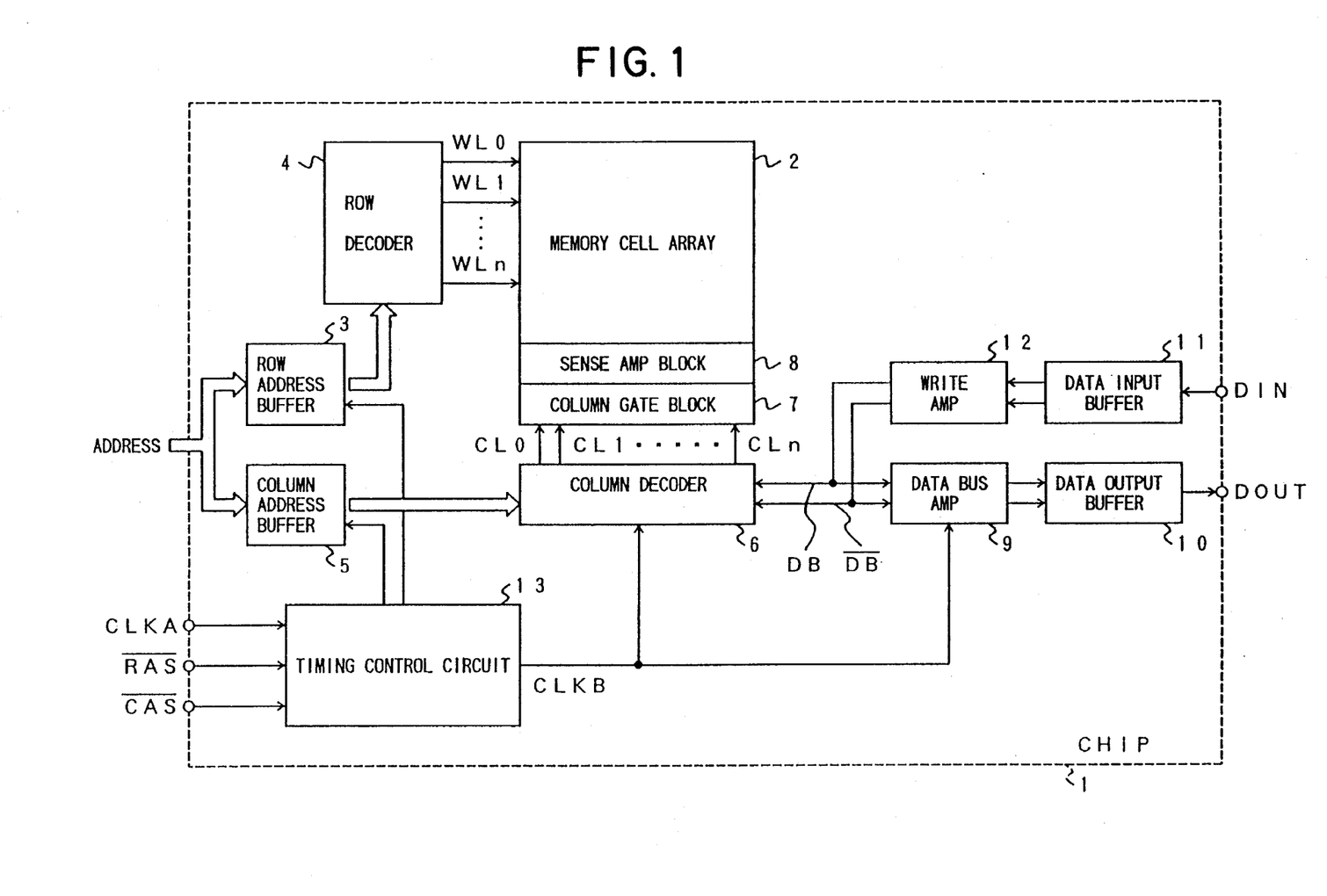
FIG. 1 is a block diagram of a synchronous DRAM device related to the present invention.

FIG. 1 is a block diagram of a synchronous DRAM device related to the present invention. The synchronous DRAM has a chip body 1 on which is formed, memory cell array 2 having memory cells arranged in a matrix formation, and the following elements.

A row address buffer 3 receives a row address signal which is one of external row address signals, and generates therefrom complementary internal row address signals. A row decoder 4 decodes the internal row address signals output from the row address buffer 3, and selectively drives word lines WL0, WL1, ..., WLn where n is an integer. A column address buffer 5 receives a column address signal which is one of the external row address signals, and generates therefrom complementary internal column address signals. A column decoder 6 decodes the internal column address signals output from the column address buffer 5, and generates therefrom column selecting signals CL0, CL1, ..., CLn.

A column gate block 7 includes column gates, which select columns of the memory cell array 2 (bit lines) on the basis of the column selecting signals CL0, CL1, ..., CLn output from the column decoder 6. A sense amplifier block 8 includes sense amplifiers which amplify data read from the memory cell array 2. A pair of data buses DB and /DB (the symbol "/" corresponds to the "bar" attached above the symbol DB shown in FIG. 1 and means the active-low signal are selectively connected, via the column decoder 6, to the bit lines arranged in the memory cell array 2. A data bus amplifier 9 amplifies data read from the memory cell array 2 onto the pair of data buses DB and /DB. A data output buffer 10 outputs, as output data DOUT, the data amplified by the data bus amplifier 9 to the outside of the chip 1.

A data input buffer 11 receives write data DIN from the outside of the chip 1, and generates therefrom complementary write data. A write amplifier 12 is used to write the write data into the memory cell array 2. A timing control circuit 13 receives an external clock signal CLKA, a row address strobe signal /RAS and a column address strobe signal /CAS received from the outside of the chip 1, and an internal clock signal CLKB which is applied, as a timing signal, to predetermined internal circuits such as the column decoder 6 and the data bus amplifier 9.

Figure 2:
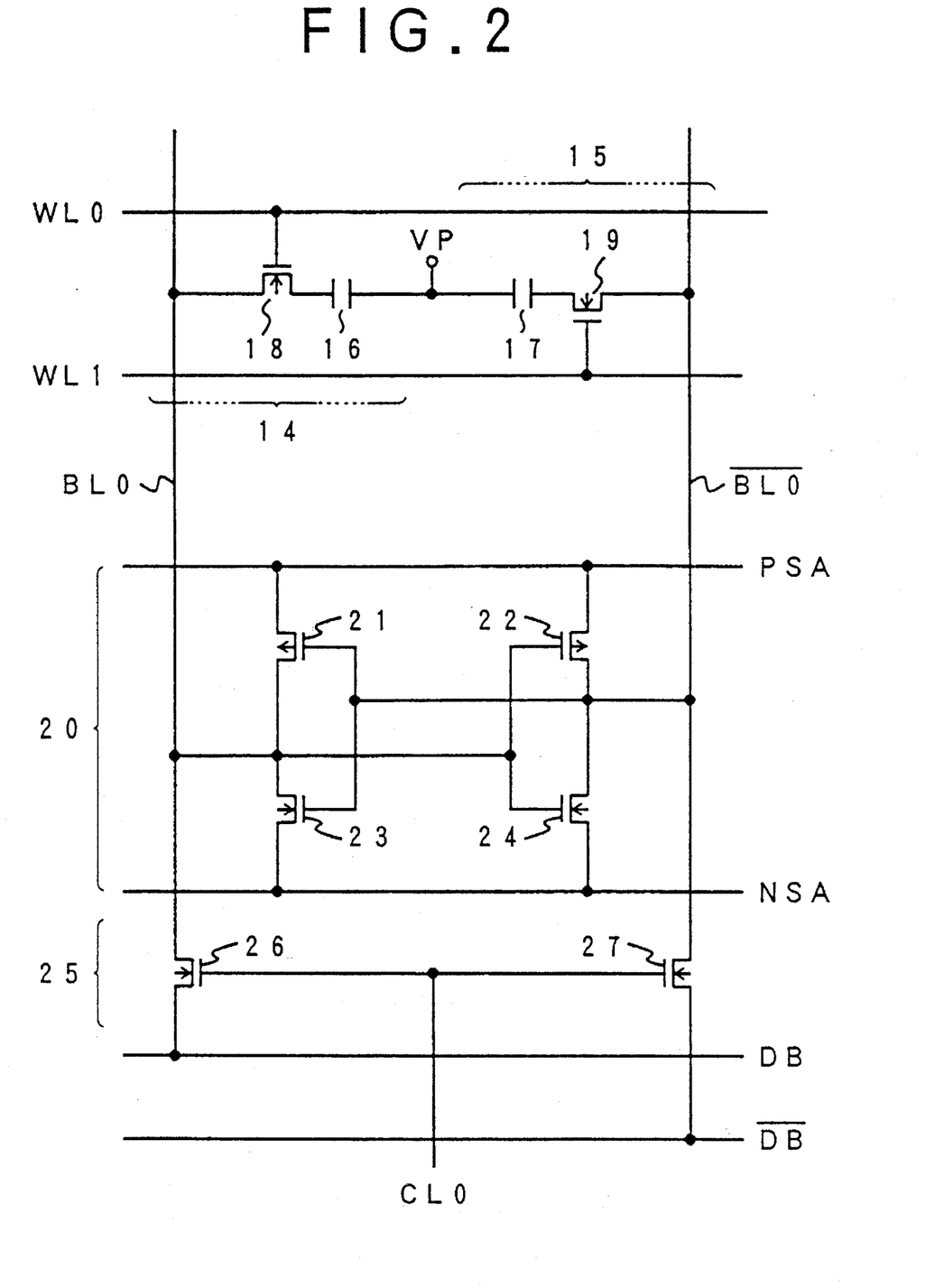
FIG. 2 is a circuit diagram of parts of a memory cell array, a sense amplifier and a column gate shown in FIG. 1.

FIG. 2 is a circuit diagram of parts of the memory cell array 2, the sense amplifier block 8 and the column gate block 7 shown in FIG. 1. The memory cell array 2 includes memory cells 14 and 15, which are respectively made up of capacitors 16 and 17 functioning as storage elements, and n-channel metal oxide semiconductor (hereinafter referred to as nMOS) transistors 18 and 19. A plate voltage VP is applied to the capacitors 16 and 17, as shown in FIG. 2. A pair of bit lines BL0 and /BL0 are connected to the memory cells 14 and 15, respectively. A sense amplifier 20 connected to the pair of bit lines BL0 and /BL0 includes p-channel metal oxide semiconductor (hereinafter simply referred to as pMOS) transistors 21 and 22, and nMOS transistors 23 and 24. These transistors 21–24 are driven by sense amplifier driving signals PSA and NSA. A column gate 25 connected to the pair of bit lines BL0 and /BL0 includes nMOS transistors 26 and 27, which are turned ON/OFF by the column selecting signal CL0. The column selecting signal CL0 is switched to the high (H) level, and is maintained in the high-level state during a period equal to the high-level period of the internal clock signal CLKB. The above holds true for the other column selecting signals CL1-CLn.

Figure 3:
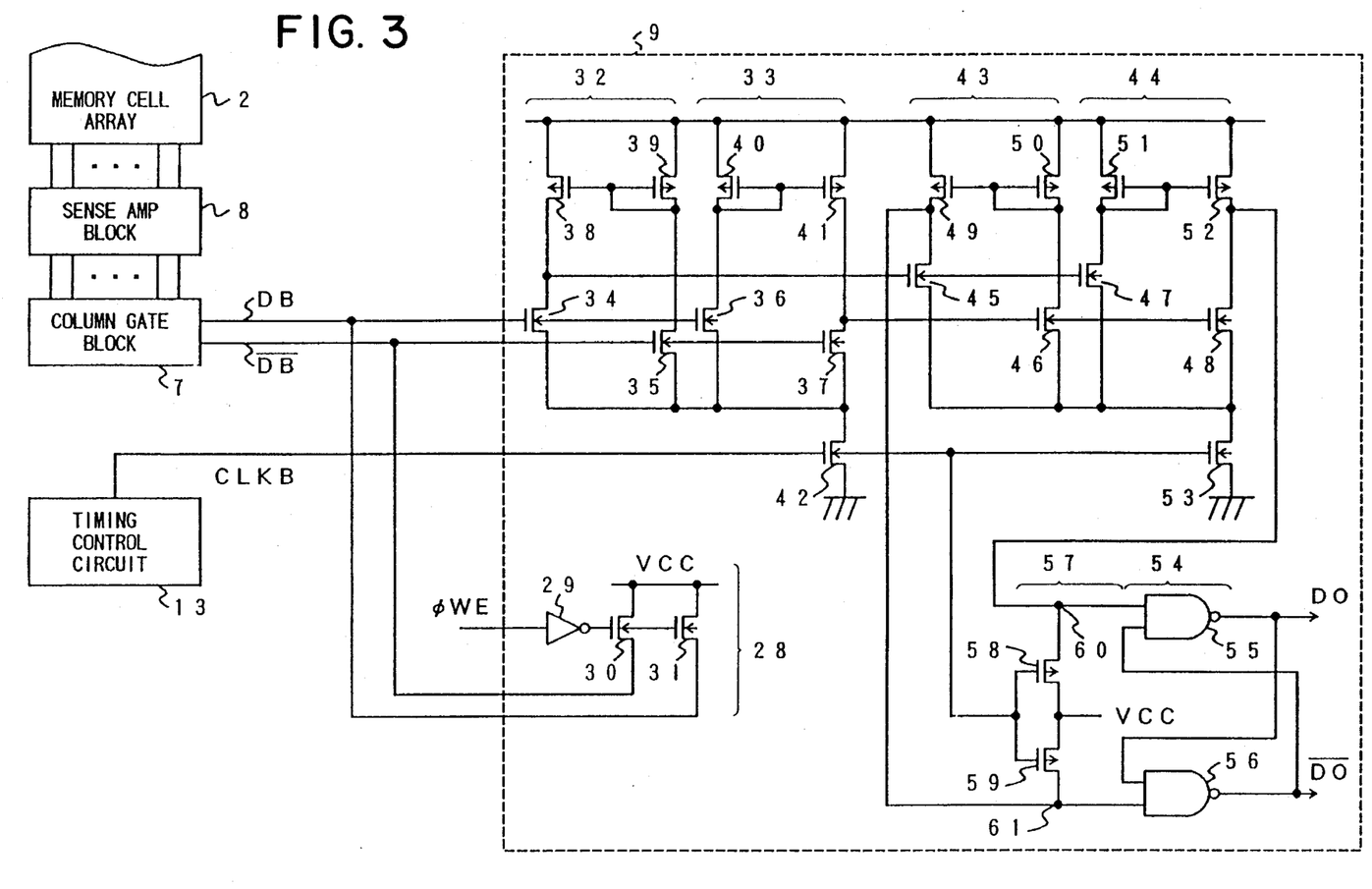
FIG. 3 is a circuit diagram of a data bus amplifier shown in FIG. 1.
Figure 4A:
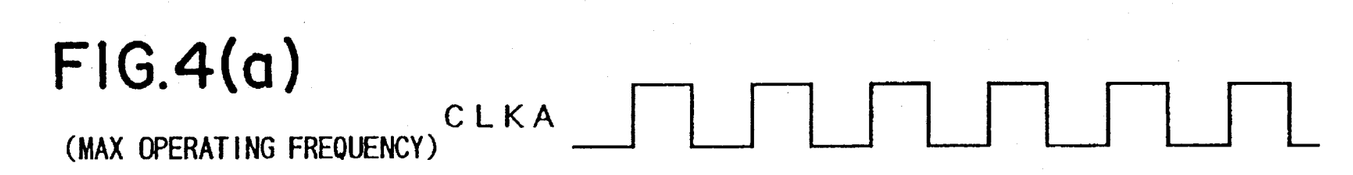
FIG. 4 is a timing chart of a timing control circuit shown in FIG. 1.
Figure 4B:
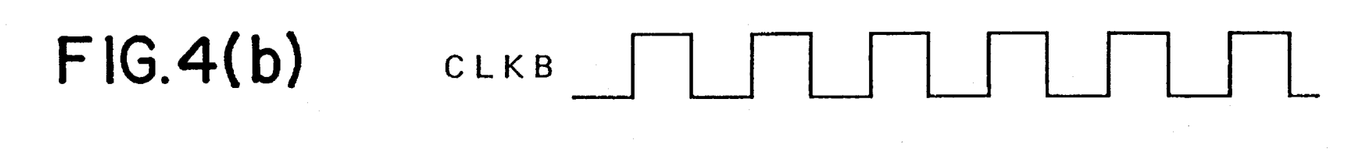
Figure 4C:
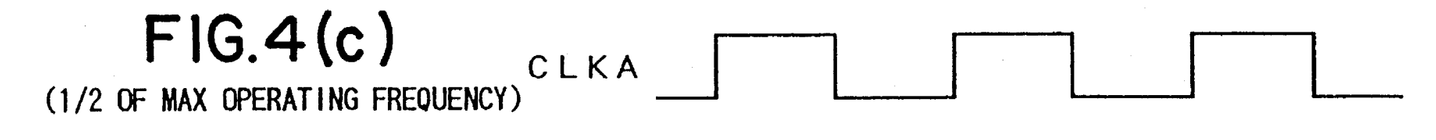
Figure 4D:
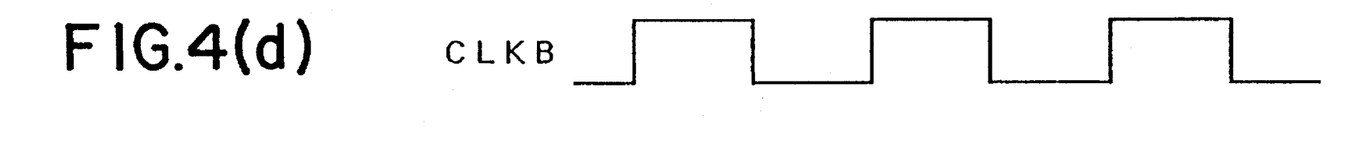
Figure 5A:
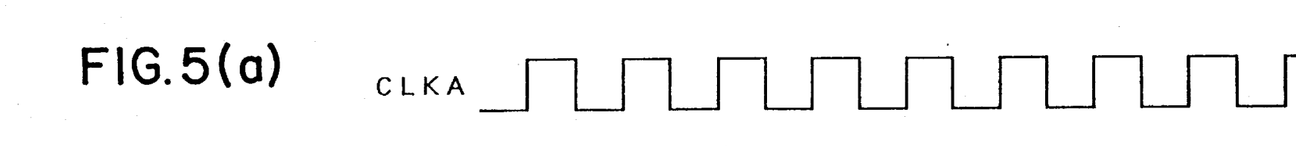
FIG. 5 is a timing chart of the operation of the synchronous DRAM device shown in FIG. 1 which is in a page mode.
Figures 5B, 5C:
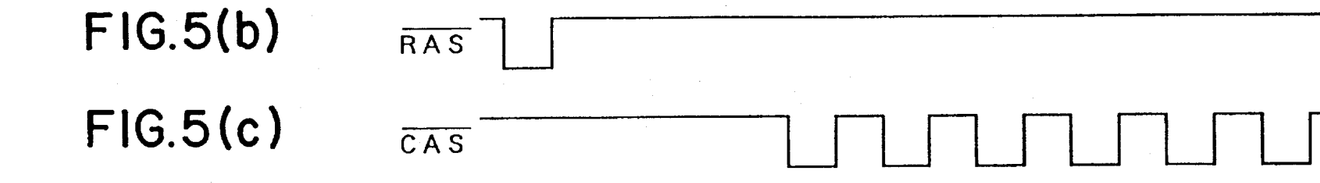
Figure 5D:
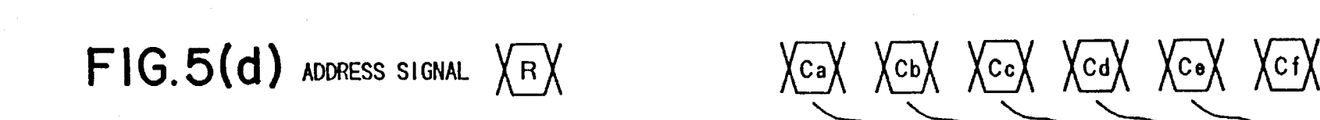
Figure 5E:
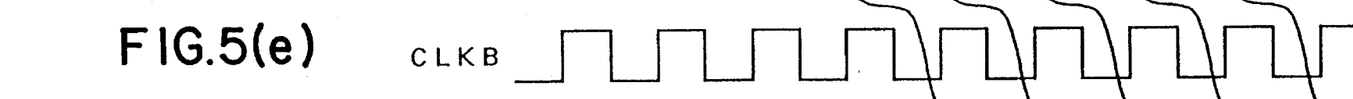
Figure 5F:
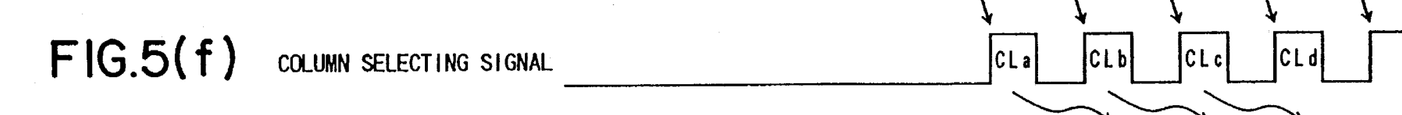
Figure 5G:
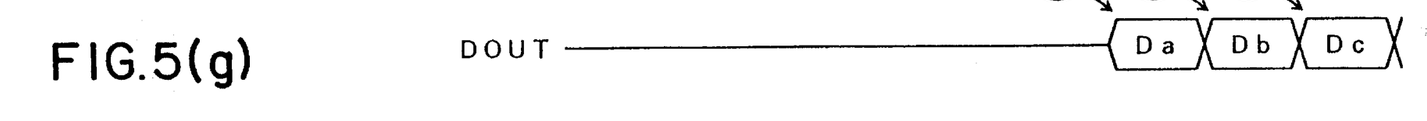

FIG. 3 shows the circuit configuration of the data bus amplifier 9. As shown in FIG. 3, the data bus amplifier 9 includes a data bus load circuit 28 to which a write control signal $\phi_{WE}$ is input. The load circuit 28 is made up of an inverter 29, and two nMOS transistors 30 and 31 to which a power supply voltage VCC is applied. The write clock signal $\phi_{WE}$ is switched to the high level at the time of writing data into the memory cell array 2, and is switched to the low level at the time of reading data from the memory cell array 2. When data is written into the memory cell array 2, the nMOS transistors 30 and 31 are turned OFF. When data is read from the memory cell array 2, the nMOS transistors 30 and 31 are turned ON, and function as the loads of the data buses DB and /DB, respectively.

The data bus amplifier 9 includes differential amplifiers 32 and 33, which share a constant-current source. The differential amplifier 32 includes pMOS load transistors 38 and 39 and nMOS driving transistors 34 and 35. The differential amplifier 33 includes pMOS load transistors 40 and 41 and nMOS driving transistors 36 and 37. An nMOS transistor 42 forms the constant-current source shared by the differential amplifiers 32 and 33, and is turned ON/OFF by the internal clock signal CLKB.

Further, the data bus amplifier 9 includes differential amplifiers 43 and 44, which share a constant-current source. The differential amplifier 43 includes pMOS load transistors 49 and 50 and nMOS driving transistors 45 and 46. The differential amplifier 44 includes pMOS load transistors 51 and 52 and nMOS driving transistors 47 and 48. An nMOS transistor 53 forms the constant-current source shared by the differential amplifiers 43 and 44, and is turned ON/OFF by the internal clock signal CLKB.

When the internal clock signal CLKB is at the high level, the nMOS transistors 42 and 53 are ON, and the differential amplifiers 32, 33, 43 and 44 are in the active states. When the internal clock signal CLKB is at the low level, the nMOS transistors 42 and 53 are OFF, and the differential amplifiers 32, 33, 43 and 44 are in the inactive states.

Further, the data bus amplifier 9 includes a flip-flop 54, which latches the output signals of the differential amplifier 43 and 44. The flip-flop 54 includes NAND circuits 55 and 56. Further, the data bus amplifier 9 includes a flip-flop control circuit 57, which controls the operation of the flip-flop 54. The flip-flop control circuit 57 includes pMOS transistors 58 and 59, which are turned ON/OFF in response to the internal clock signal CLKB. When the internal clock signal CLKB is at the high level, the pMOS transistors 58 and 59 are OFF, and the flip-flop 54 outputs output signals DO and /DO corresponding to the output signals of the differential amplifiers 43 and 44. When the internal clock signal CLKB is switched to the low level in the above state, the pMOS transistors 58 and 59 are turned ON, and nodes 60 and 61 goes to the high level. Hence, the flip-flop 54 is switched to the hold state and holds the input data.

FIG. 4 is a timing chart of the operation of the timing control circuit 13, and shows the relation between the external clock signal CLKA and the internal clock signal CLKB. More particularly, part (a) of FIG. 4 shows the external clock signal CLKA of a frequency equal to the maximum operating frequency, and part (b) thereof shows the internal clock signal CLKB output by the timing control circuit 13 when the external clock signal CLKA shown in part (a) is supplied thereto. Part (c) of FIG. 4 shows the external clock signal CLKA of a frequency equal to half the maximum operating frequency, and part (d) thereof shows the internal clock signal CLKB output by the timing control circuit 13 when the external clock signal CLKA shown in part (c) is supplied thereto.

As shown in parts (a) through (d) of FIG. 4, the timing control circuit 13 generates, from the external clock signal CLKA, the internal clock signal CLKB having the same frequency and high-level period as those of the external clock signal CLKA supplied from the outside of the synchronous DRAM device. The internal clock signal CLKB thus generated is supplied to, for example, the column decoder 6 and the data bus amplifier 9.

FIG. 5 is a timing chart of a random column address mode of the synchronous DRAM device shown in FIG. 1, that is, of the read operation performed in a page mode. More particularly, part (a) of FIG. 5 shows the external clock signal CLKA of a frequency equal to half the maximum operating frequency, and parts (b) and (c) thereof show the row address strobe signal /RAS and the column address strobe signal /CAS, respectively. Part (d) of FIG. 5 shows address signals latched in the synchronous DRAM device, in which R denotes the row address signal, and Ca through Cf denote column address signals. Part (e) of FIG. 5 shows the internal clock signal CLKB output by the timing control circuit 13, and part (f) thereof shows the column selecting signal output to the column gate block 7 from the column decoder 6. Part (g) of FIG. 5 shows the output data DOUT.

In the page mode of the synchronous DRAM, the row address strobe signal /RAS is switched to the low level (active level), the row address signal R is latched, and the related word line is selected. Thereafter, the column address strobe signal /CAS is repeatedly switched to the low level (active level) with a constant period, and hence the column address signals Ca through Cf are latched serially. Then the column selecting signals CLa through CLf for selecting the columns are serially output to the column gate block 7 from the column decoder 6. Hence, data stored in the memory cells related to address signals [R, Ca] through [R, Cf] are serially read to the data buses DB and /DB, and are externally output, as the output data DOUT, via the data bus amplifier 9 and the data output buffer 10.

In the above operation, the differential amplifiers 32, 33, 43 and 44 are active when the internal clock signal CLKB is at the high level, so that currents flow from the VCC power supply line to the ground and power is consumed. The timing control circuit 13 is configured so that it outputs the internal clock signal CLKB to the data bus amplifier 9, the internal clock signal CLKB having the same frequency and high-level period as those of the external clock signal CLKA. Hence, when the frequency of the external clock signal is half the maximum operating frequency of the synchronous DRAM device, the high-level period of the internal clock signal CLKB increases to twice that obtained when the frequency of the external clock signal CLKA is equal to the maximum operating frequency. Hence, the operating (active) period of the data bus amplifier 9 is elongated and an increased amount of current flows in the data bus amplifier 9. As described above, an increased amount of current flows in the synchronous DRAM device during a longer operating period when it is operated at a frequency lower than the maximum operating frequency, and hence an increased amount of power is consumed.

Figure 6:
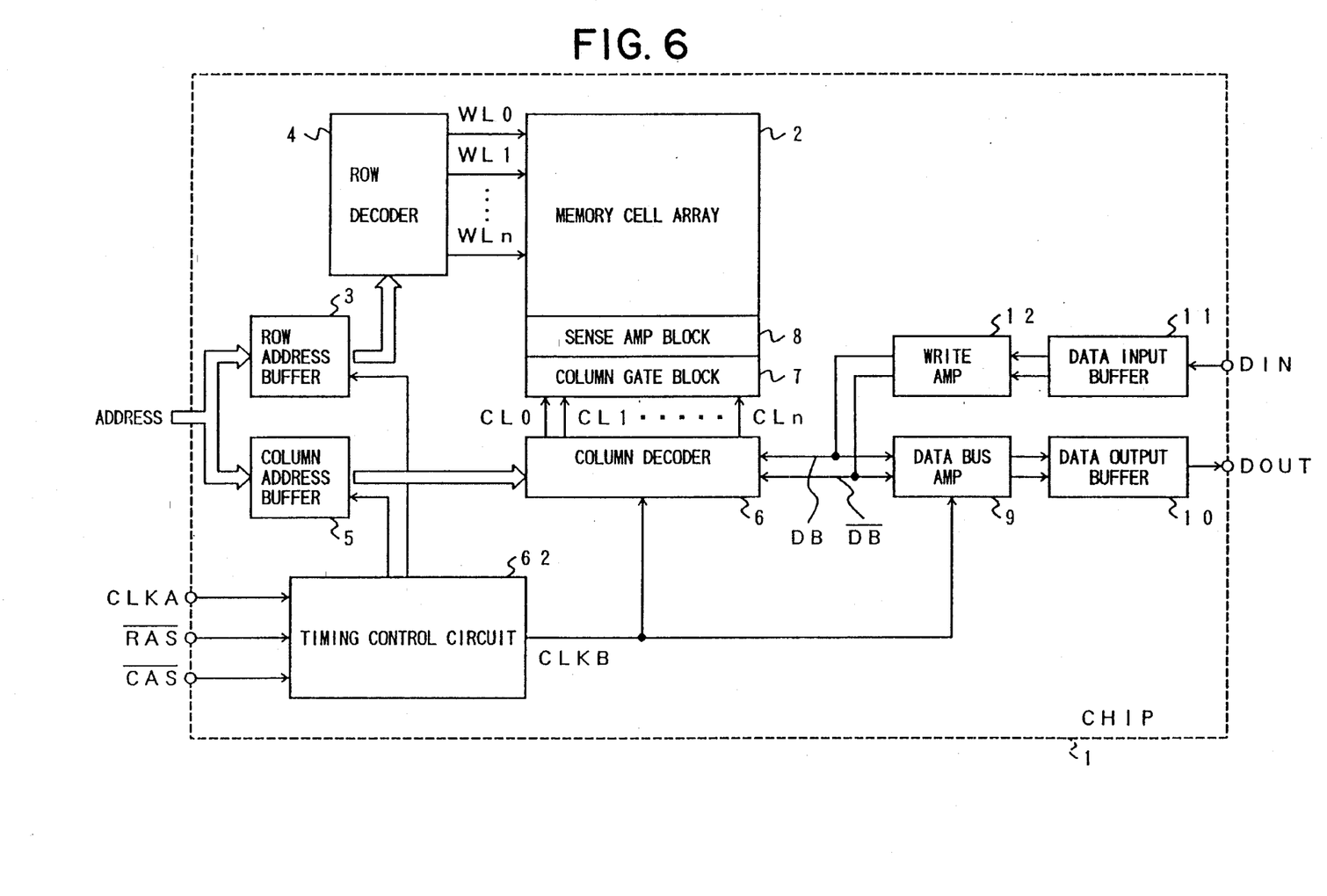
FIG. 6 is a block diagram of a synchronous DRAM device according to an embodiment of the present invention.

FIG. 6 shows a synchronous DRAM device according to an embodiment of the present invention. In FIG. 6, parts that are the same as those shown in the previously described figures are given the same reference numbers. The structure shown in FIG. 6 is configured so that structural parts operating in synchronism with the internal clock signal have a constant or approximately constant operating period and allow the constant or approximately constant currents to flow irrespective of whether the external clock signal is equal to or lower than the maximum operating frequency in order to reduce the power consumption when the synchronous DRAM device is operated at a frequency lower than the maximum operating frequency.

In FIG. 6, a timing control circuit 62 generating the internal clock signal CLKB is used instead of the timing control circuit 13 shown in FIG. 1. The timing control circuit 62 has a circuit configuration different from that of the timing control circuit 13.

Figure 7:
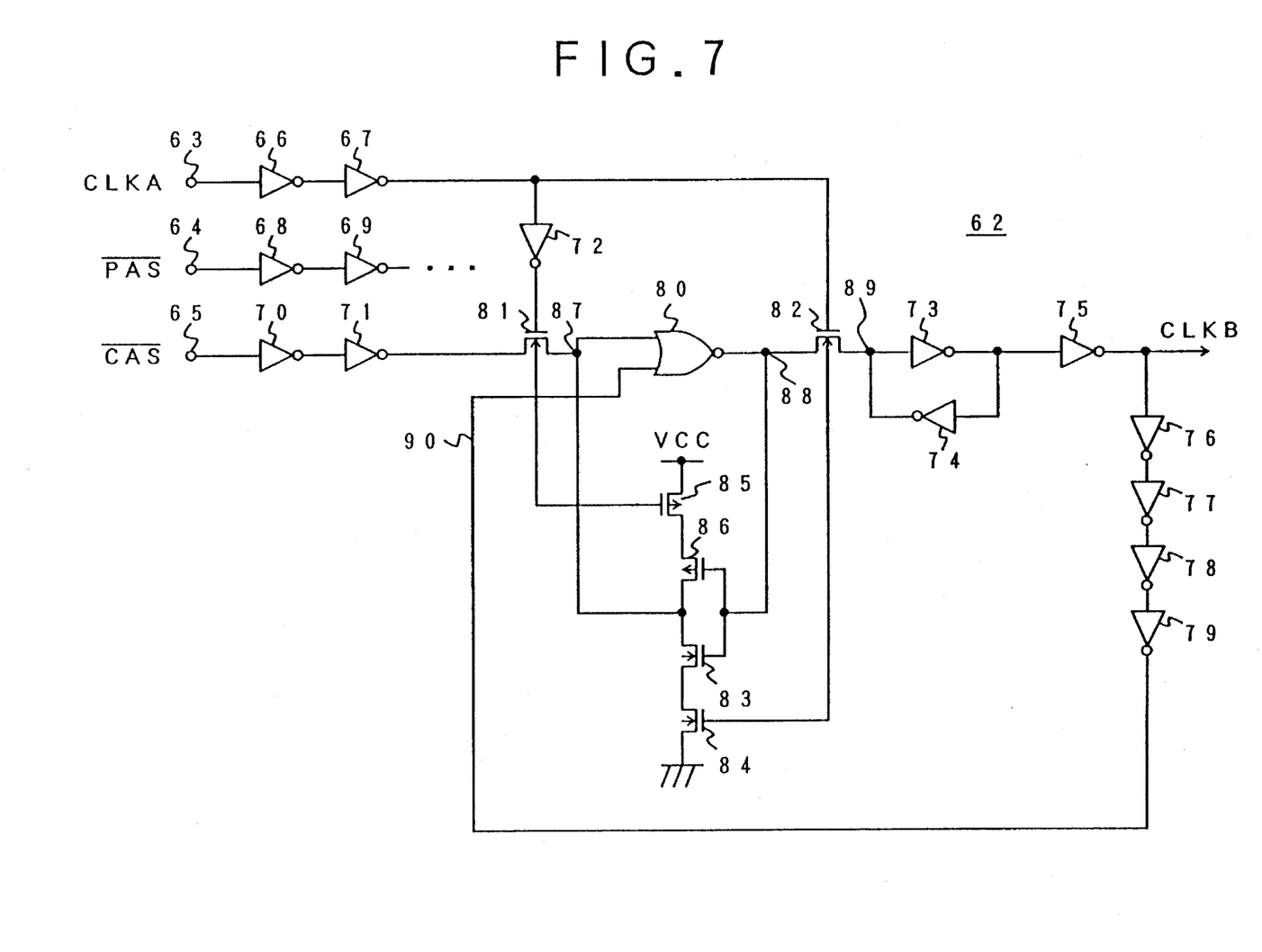
FIG. 7 is a circuit diagram of a timing control circuit shown in FIG. 6.
Figure 8A:
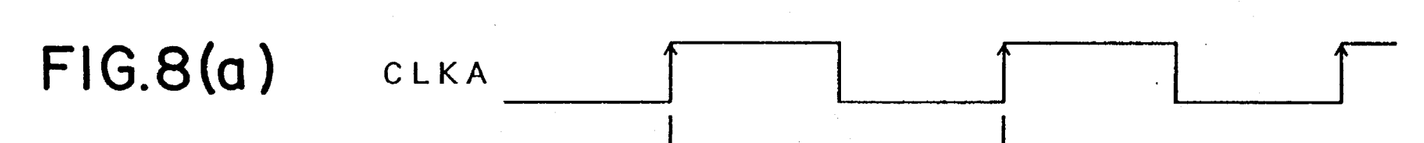
FIG. 8 is a timing chart of the timing control circuit shown in FIG. 7.
Figure 8B:
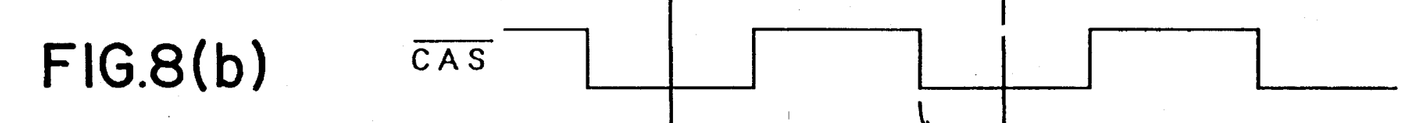
Figures 8C, 8D:
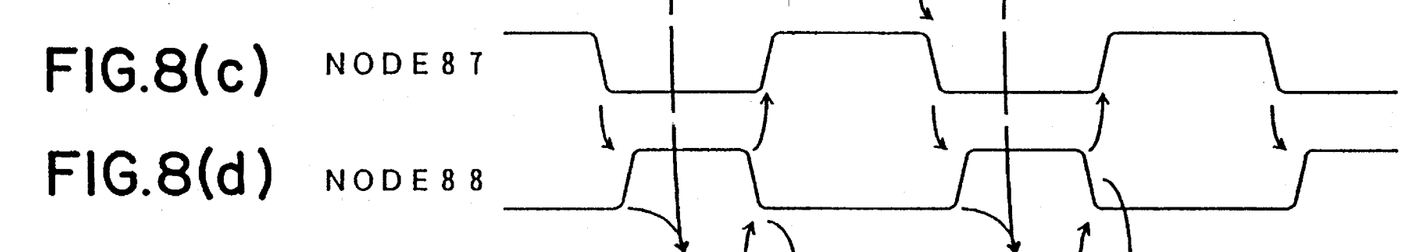
Figures 8E, 8F:
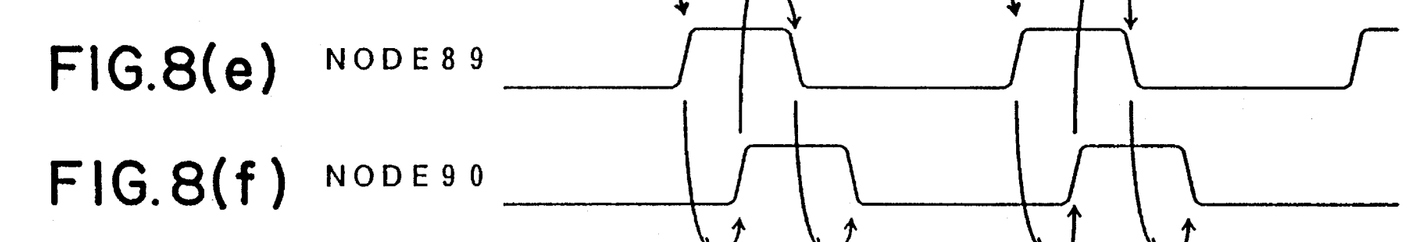
Figure 8G:
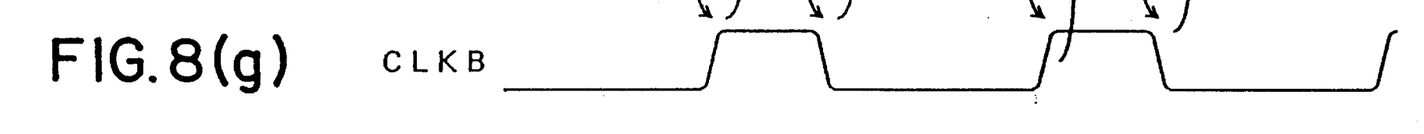
Figure 9A:
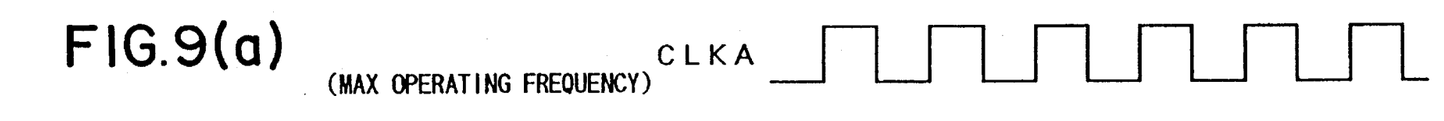
FIG. 9 is a timing chart showing the relation between an external clock signal and an internal clock signal in the structure shown in FIG. 6.
Figure 9B:
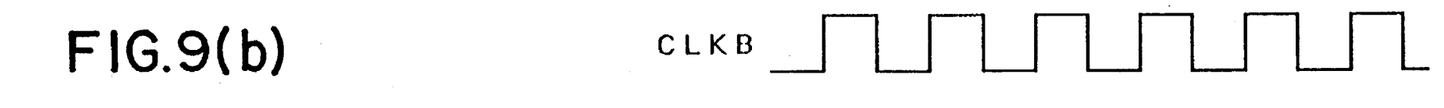
Figure 9C:
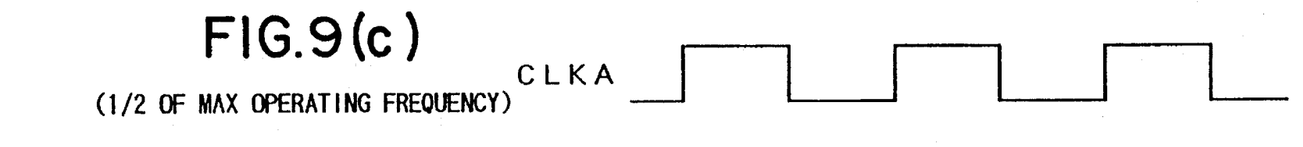
Figure 9D:
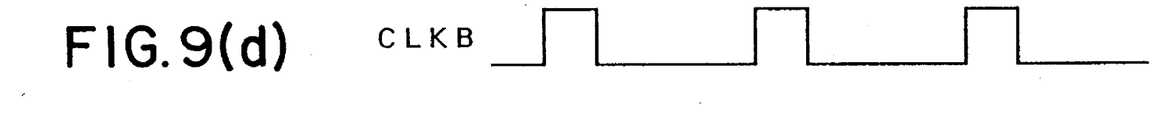

FIG. 7 is a circuit diagram of an essential part of the timing control circuit 62 shown in FIG. 6. The external clock signal CLKA supplied from the outside of the chip 1 is applied to a clock signal input terminal 63. Further, the circuit 62 has a row address strobe signal input terminal 64 to which the row address strobe signal /RAS is applied, and a column address strobe signal input terminal 65 to which the column address strobe signal /CAS is applied. Further, the timing control circuit 62 includes inverters 66 through 79, a NOR circuit 80, nMOS transistors 81–84 and pMOS transistors 85 and 86.

FIG. 8 is a timing chart of the operation of the essential part of the timing control circuit 62 shown in FIG. 7. Part (a) of FIG. 8 shows the external clock signal CLKA, and part (b) thereof shows the column address strobe signal /CAS. Part (c) of FIG. 8 shows a change in the potential of a node 87 shown in FIG. 7, and part (d) thereof shows a change in the potential of a node 88. Similarly, part (e) of FIG. 8 shows a change in the potential of a node 89 shown in FIG. 7, and part (f) thereof shows a change in the potential of a node 90. Further, part (g) of FIG. 8 shows the internal clock signal CLKB.

In the circuit configuration shown in FIG. 8, the low level of the column address strobe signal /CAS is detected in synchronism with the rising edge of the external clock signal CLKA. The internal clock signal CLKB has a constant high-level (active) period (width) equal to the high-level period (width) of the external clock signal CLKA of, for example, the maximum operating frequency. In the case where the external clock signal CLKA has a frequency lower than the maximum operating frequency, when the high-level period (frequency) of the internal clock signal CLKB is shorter (higher) than the period corresponding to the above frequency of the external clock signal CLKA, the embodiment of the present invention being considered is advantageous over the structure shown in FIGS. 1 through 5. The internal clock signal CLKB shown in part (g) of FIG. 8 is applied to predetermined structural parts of the synchronous DRAM device shown in FIG. 6, such as the column decoder 6 and the nMOS transistors 42 and 53 of the data bus amplifier 9 shown in FIG. 10, which will be described in detail later.

Referring to FIG. 9, part (a) shows the external clock signal CLKA of a frequency equal to the maximum operating frequency, and part (b) shows the internal clock signal CLKB generated by the timing control circuit 62 in response to the external clock signal CLKB shown in part (a). Further, part (c) of FIG. 9 shows the external clock signal CLKA of a frequency equal to half the maximum operating frequency, and part (b) shows the internal clock signal CLKB generated by the timing control circuit 62 in response to the external clock signal CLKB shown in part (a). The frequencies and the high-level periods of the internal clock signals CLKB shown in parts (b) and (d) are the same as each other.

Figure 10:
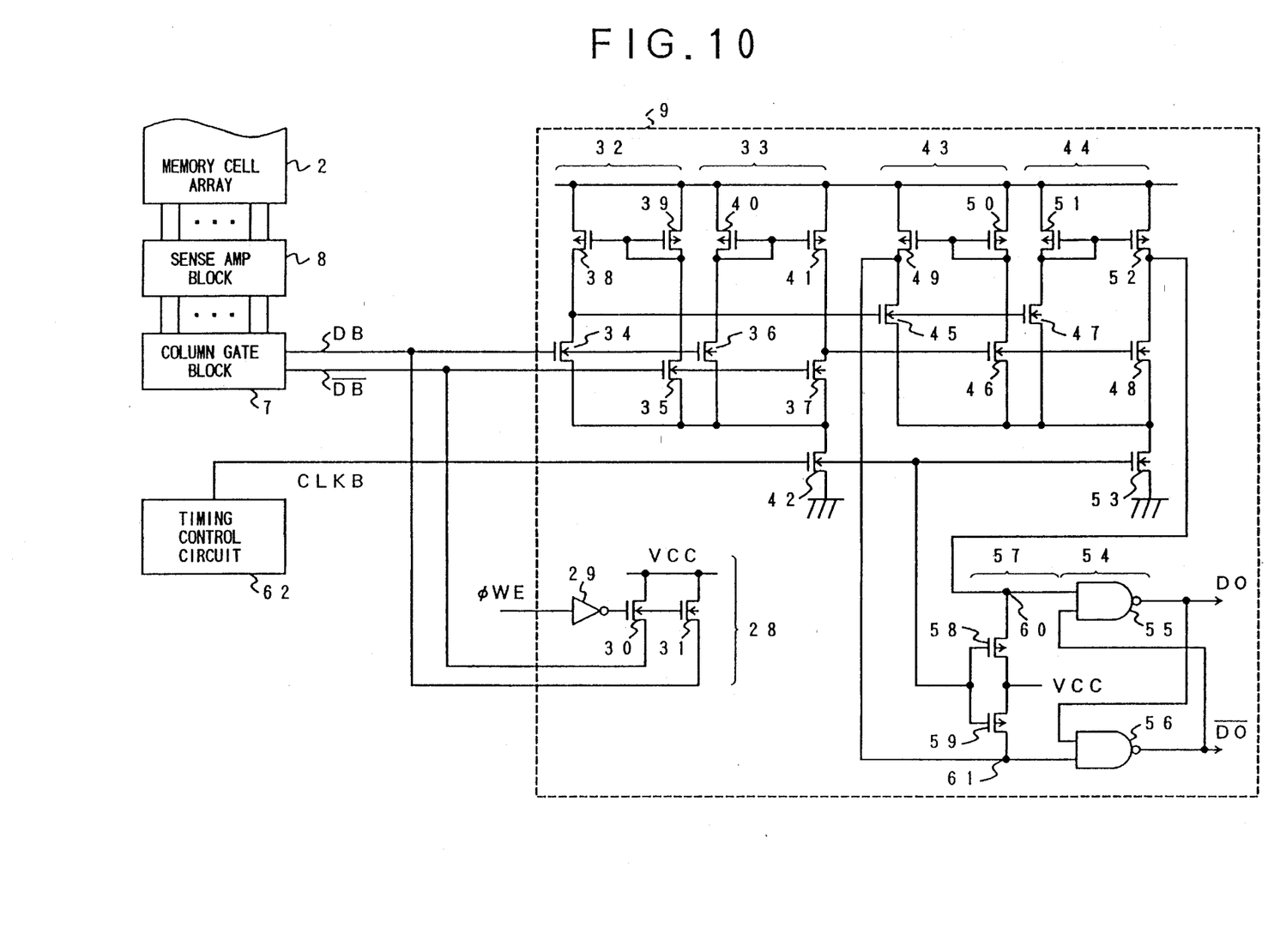
FIG. 10 is a circuit diagram showing the relation between the data bus amplifier and the timing control circuit 62 in the structure shown in FIGS. 6 and 7.
Figure 11A:
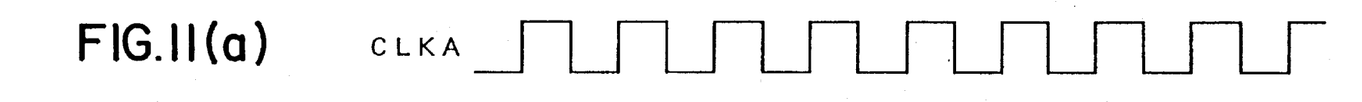
FIG. 11 is a timing chart of the operation of the synchronous DRAM device shown in FIG. 6.
Figure 11B:
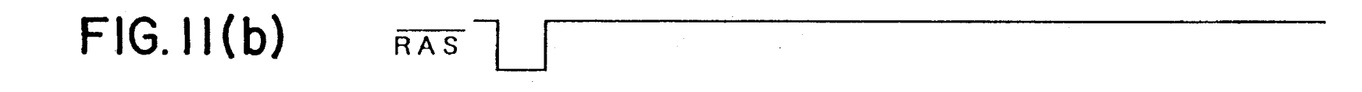
Figure 11C:
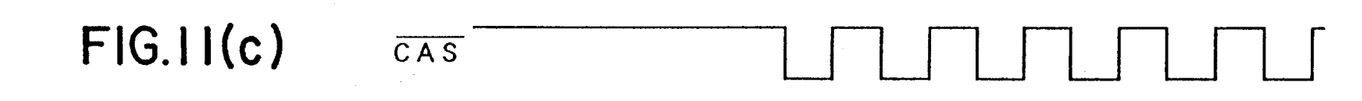
Figure 11D:
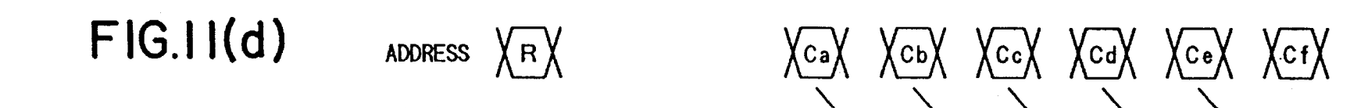
Figure 11E:
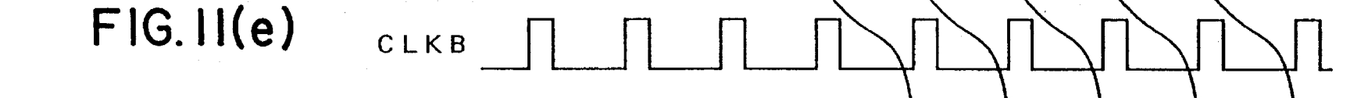
Figure 11F:
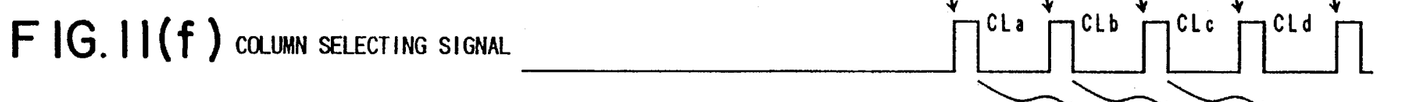
Figure 11G:
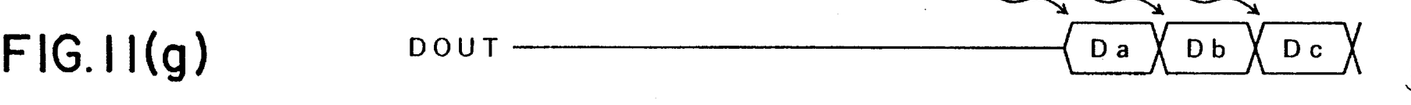

FIG. 10 shows the circuit configuration of the data bus amplifier 9 connected to the timing control circuit 62 according to the embodiment of the present invention. In FIG. 10, parts that are the same as those shown in the previously described figures are given the same reference numbers.

FIG. 11 is a timing chart of a random column address mode of the synchronous DRAM device shown in FIG. 6, that is, of the read operation performed in the page mode. More particularly, part (a) of FIG. 11 shows the external clock signal CLKA of a frequency equal to half the maximum operating frequency, and parts (b) and (c) thereof show the row address strobe signal /RAS and the column address strobe signal /CAS, respectively. Part (d) of FIG. 11 shows address signals latched in the synchronous DRAM device, in which R denotes the row address signal, and Ca through Cf denote column address signals. Part (e) of FIG. 11 shows the internal clock signal CLKB output by the timing control circuit 62, and part (f) thereof shows the column selecting signal output to the column gate block 7 from the column decoder 6. Part (g) of FIG. 11 shows the output data DOUT.

In the page made of the synchronous DRAM device, the row address strobe signal /RAS is switched to the low level (active level), the row address signal R is latched, and the related word line is selected. Thereafter, the column address strobe signal /CAS is repeatedly switched to the low level (active level) with a constant period, and thence the column address signals Ca through Cf are latched serially. Then the column selecting signals CLa through CLf for selecting the columns are serially output to the column gate block 7 from the column decoder 6. Hence, data stored in the memory cells related to address signals [R, Ca] through [R, Cf] are serially read onto the data buses DB and /DB, and are externally output, as the output data DOUT, via the data bus amplifier 9 and the data output buffer 10.

In the above operation, the differential amplifiers 32, 33, 43 and 44 are active when the internal clock signal CLKB is at the high level, so that currents flow from the VCC power supply line to the ground and power is consumed.

The timing control circuit 63 is configured so that it outputs the internal clock signal CLKB to the data bus amplifier 9, the internal clock signal CLKB having the same frequency and high-level period as those of the external clock signal CLKA having the maximum operating frequency. Hence, even when the frequency of the external clock signal is half the maximum operating frequency of the synchronous DRAM device, the frequency and the high-level period of the internal clock signal CLKB are not changed. Hence, the operating (active) period of the data bus amplifier 9 is kept constant and the same amount of current as that obtained when the DRAM device is operated at the maximum operating frequency flows in the data bus amplifier 9, and there is no increase in power consumption.

As described above, according to the embodiment of the present invention, the amount of current (power) is not increased even if the DRAM device is operated at a frequency lower than the maximum operating frequency.

The present invention is not limited to the specifically described embodiment, but includes other semiconductor memory devices equipped with a timing control circuit in which an internal clock signal is generated from the external clock signal and is supplied to predetermined structural parts as a timing signal.

What is claimed is:

1. A semiconductor memory device, comprising:

memory cell array;

address means for supplying address signals to the memory cell array;

read/write means for reading data from the memory cell array and writing data into the memory cell array; and internal clock signal generating means for generating an internal clock signal from an external clock signal, the internal clock signal having a cycle with an active-level portion of constant duration independent of a frequency of the external clock signal and being output, as a timing signal, to predetermined structural parts of the address means and/or the read/write means, wherein the external clock signal includes one of a first frequency and a second frequency, said second frequency being lower than said first frequency, and wherein the active-level period of the internal clock signal corresponds to that of the first frequency of the external clock signal even when the external clock signal actually applied to the internal clock signal generating means is at the second frequency.

2. The semiconductor memory device as claimed in claim 1, wherein said internal clock signal generating means generates the internal clock signal with a frequency equal to a maximum operating frequency of the semiconductor memory device defined by the external clock signal.

3. The semiconductor memory device as claimed in claim 1, wherein said internal clock signal generating means generates the internal clock signal with a frequency close to a maximum operating frequency of the semiconductor memory device defined by the external clock signal.

4. The semiconductor memory device as claimed in claim 1, wherein the cycle with the active-level portion of constant duration of the internal clock signal is equal to that of the external clock signal defining a maximum operating frequency of the semiconductor memory device.

5. The semiconductor memory device as claimed in claim 1, wherein the cycle with the active-level portion of constant duration of the internal clock signal is slightly longer than that of the external clock signal defining a maximum operating frequency of the semiconductor memory device.

6. The semiconductor memory device as claimed in claim 1, wherein the frequency of the internal clock signal is higher than a frequency of the external clock signal, said frequency of the external clock signal being lower than a maximum operating frequency of the semiconductor memory device.

7. The semiconductor memory device as claimed in claim 1, wherein:

the predetermined structural parts comprise switches for connecting the predetermined structural parts to a power supply system; and the internal clock signal is applied to said switches.

8. The semiconductor memory device as claimed in claim 1, wherein the memory cell array comprises memory cells, each having a capacitor.

9. The semiconductor memory device as claimed in claim 1, wherein the predetermined structural parts comprise a data bus amplifier connected to a data bus connected to a bit line provided in the memory cell array, said data bus being connected to a data output terminal of the semiconductor memory device for an external connection.

10. The semiconductor memory device as claimed in claim 1, wherein the predetermined structural parts comprise a decoder which selects columns of the memory cell array.

* * * * *